United States Patent [19]

Aldereguia et al.

[11] Patent Number: 5,226,134
[45] Date of Patent: Jul. 6, 1993

[54] DATA PROCESSING SYSTEM INCLUDING A MEMORY CONTROLLER FOR DIRECT OR INTERLEAVE MEMORY ACCESSING

[75] Inventors: Alfredo Aldereguia, Boca Raton; Daryl C. Cromer; Roger M. Stutes, both of Delray Beach, all of Fla.

[73] Assignee: International Business Machines Corp., Armonk, N.Y.

[21] Appl. No.: 591,306

[22] Filed: Oct. 1, 1990

[51] Int. Cl.⁵ ............................................. G06F 12/00
[52] U.S. Cl. ................................... 395/425; 395/400; 364/DIG. 1
[58] Field of Search ... 364/200 MS File, 900 MS File; 395/425, 400; 365/230.03, 230.06

[56] References Cited

U.S. PATENT DOCUMENTS

| | | | |
|---|---|---|---|
| 4,104,735 | 8/1978 | Hofmann et al. | 365/230.06 |
| 4,542,486 | 9/1985 | Anami et al. | 365/230.03 |
| 4,660,178 | 4/1987 | Hardee et al. | 365/230.06 |
| 4,731,761 | 3/1988 | Kobayashi | 365/230.06 |
| 4,967,397 | 10/1990 | Walck | 365/230.03 |

Primary Examiner—Joseph L. Dixon
Assistant Examiner—Frank J. Asta
Attorney, Agent, or Firm—G. E. Grosser; D. R. McKechnie

[57] ABSTRACT

A data processing system includes a processor for accessing a memory in either a direct mode or an indirect mode. The memory includes at least two memory banks and two decoders for decoding bank addresses. The decoders produce bank select signals. In direct mode, the decoder outputs are generated according to which bank is addressed. In interleave mode, the two decoder outputs are ANDed to select both banks covering the address range of the selected banks.

3 Claims, 6 Drawing Sheets

DATA PROCESSING SYSTEM INCLUDING A MEMORY CONTROLLER FOR DIRECT OR INTERLEAVE MEMORY ACCESSING

FIELD OF THE INVENTION

This invention relates to the field of data processing and, more particularly, to a data processing system having a memory controller which supports both direct and interleave accessing of a dynamic read/write memory.

BACKGROUND OF THE INVENTION

Personal computers commonly use dynamic memory read/write chips that are addressed or selected as physical banks, the chips being arranged in single in-line memory modules (SIMMs). Row address strobe (RAS) signals are used to select the physical banks of memory. In a system with, for example, sixteen banks, sixteen unique RAS lines are required. Lower cost, high performance memory systems are designed to operate in a direct mode wherein only one RAS line is active at any one time. In contrast, higher cost, high performance memory systems are designed with a wider memory data path and operate in an interleaved mode so that two RAS lines are simultaneously active for two bank interleaving.

Typically a memory controller is connected between the memory and a microprocessor, a direct memory access (DMA) controller, and other devices which access the memory. One of the functions of a memory controller is to decode the addresses of the locations to be accessed and generate the appropriate RAS select signal(s) for activating the proper memory bank(s) in accordance with the mode (direct or interleaved) of operation. In the direct mode, a memory controller need only have one decoder per memory bank, whereas in the interleaved mode, the controller needs only one decoder per two banks, the banks being arranged in pairs. A memory controller that supports both modes must provide a decoding mechanism for both modes. Typically, this is done by using two sets of decoders, one set being one decoder per bank for direct mode and the other set being one decoder per pair of banks for interleaved mode. Additional decode logic is needed to select the appropriate set.

SUMMARY OF THE INVENTION

One of the objects of the invention is to provide a data processing system having a dynamic memory and a memory controller that supports both direct and interleaved modes of operation, the controller being designed with fewer circuits than the number required by the prior art discussed above.

Another object is to provide a memory controller operable in either a direct mode, requiring one decoder per memory bank, or in an interleaved mode that uses only the decoders used for the direct mode and a simple logic circuit that does not require any additional decoder as previously required for interleaved mode.

Briefly, the manner in which the above and other objects are achieved is to provide a memory controller in which the outputs of the bank decoders may be selectively transmitted directly to the associated memory banks for direct mode of operation, or paired and passed through a simple logical circuit to simultaneously access two banks in the interleaved mode.

DRAWINGS

Other objects and advantages of the invention will be apparent from the following description taken in connection with the accompanying drawings wherein.

DETAILED DESCRIPTION

Figure 1:
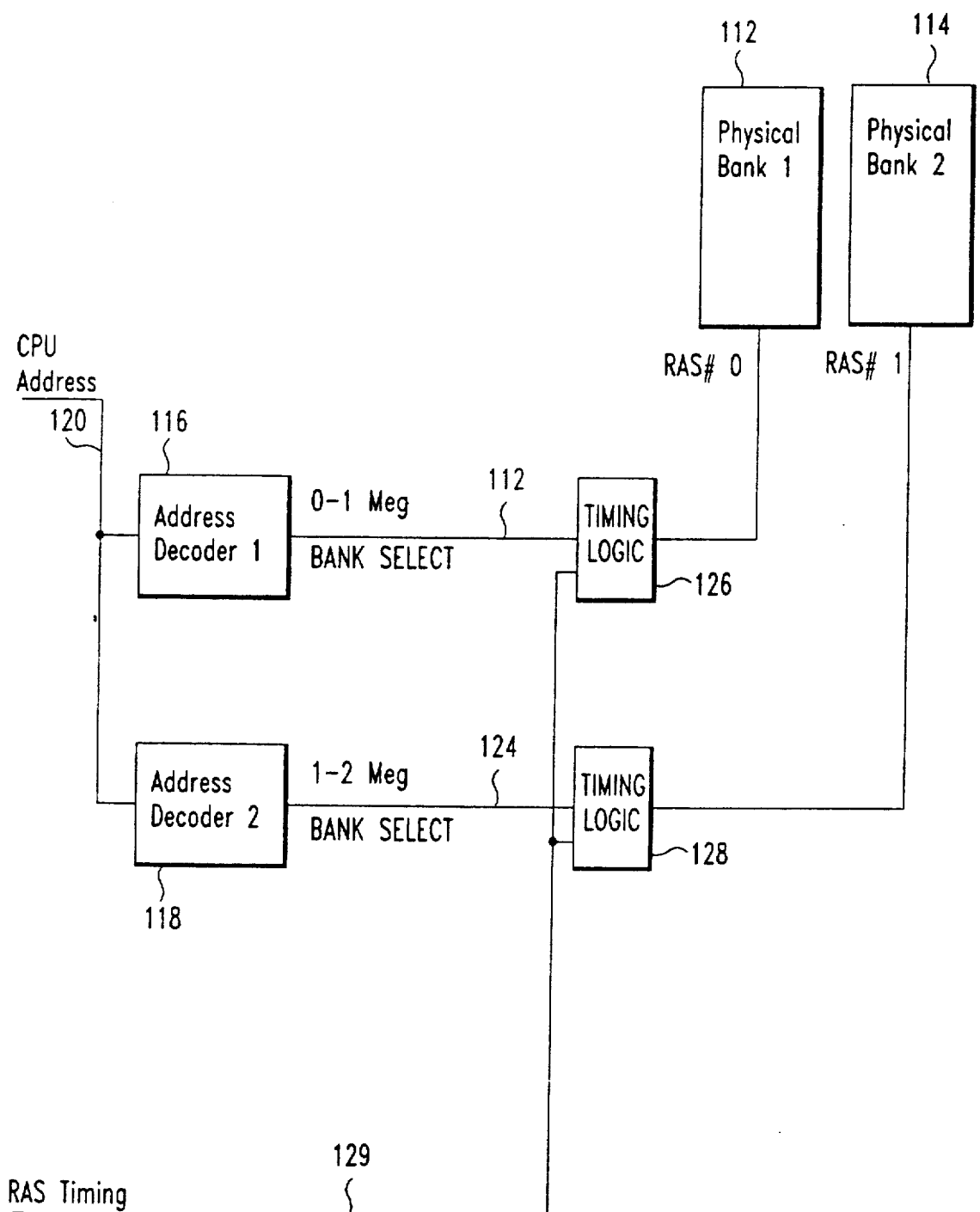
FIG. 1 is a simplified block diagram of a prior art memory bank decoding system operable in direct mode.
Figure 2:
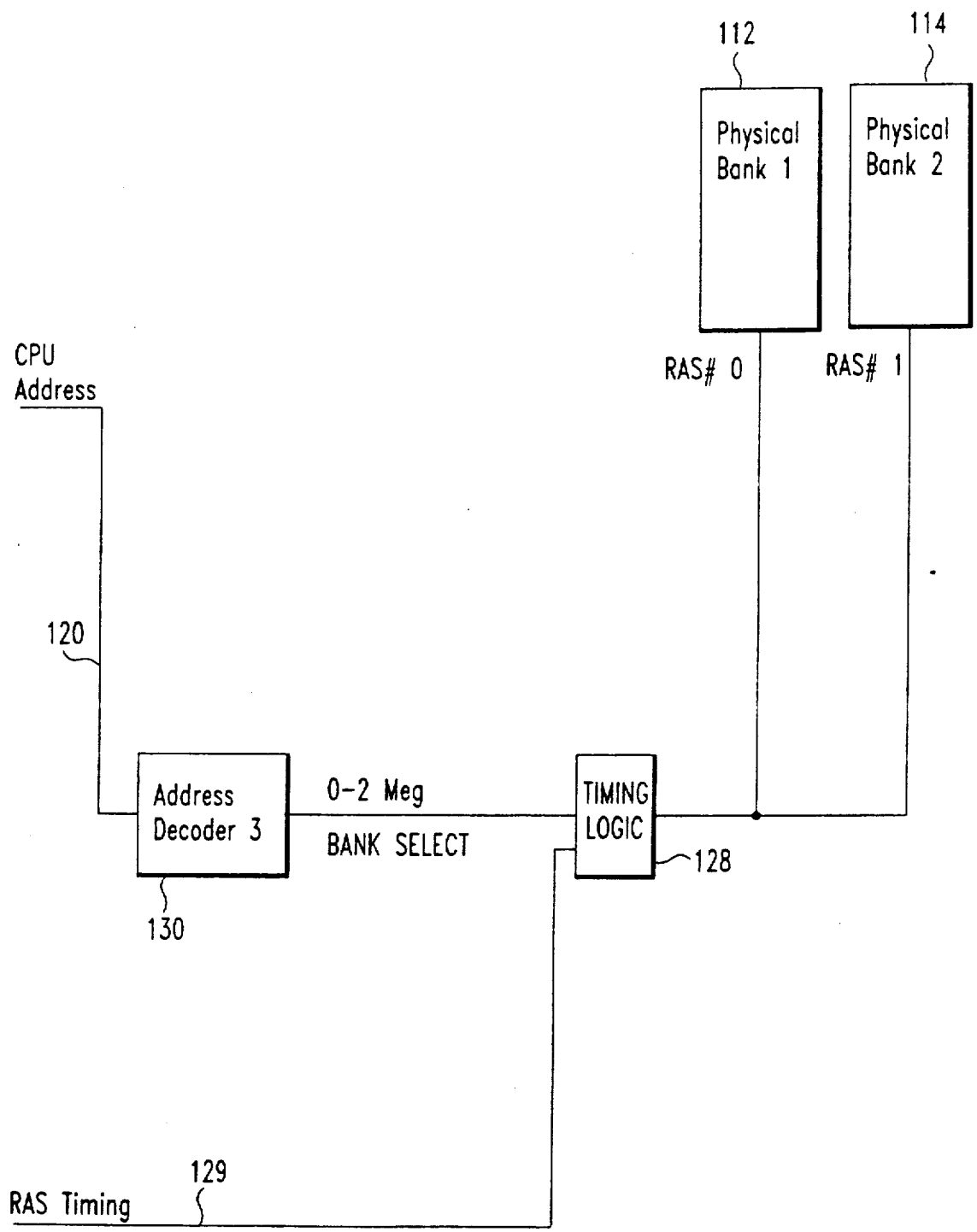
FIG. 2 is a view similar to FIG. 1 showing a prior art system operable in interleaved mode.
Figure 3:
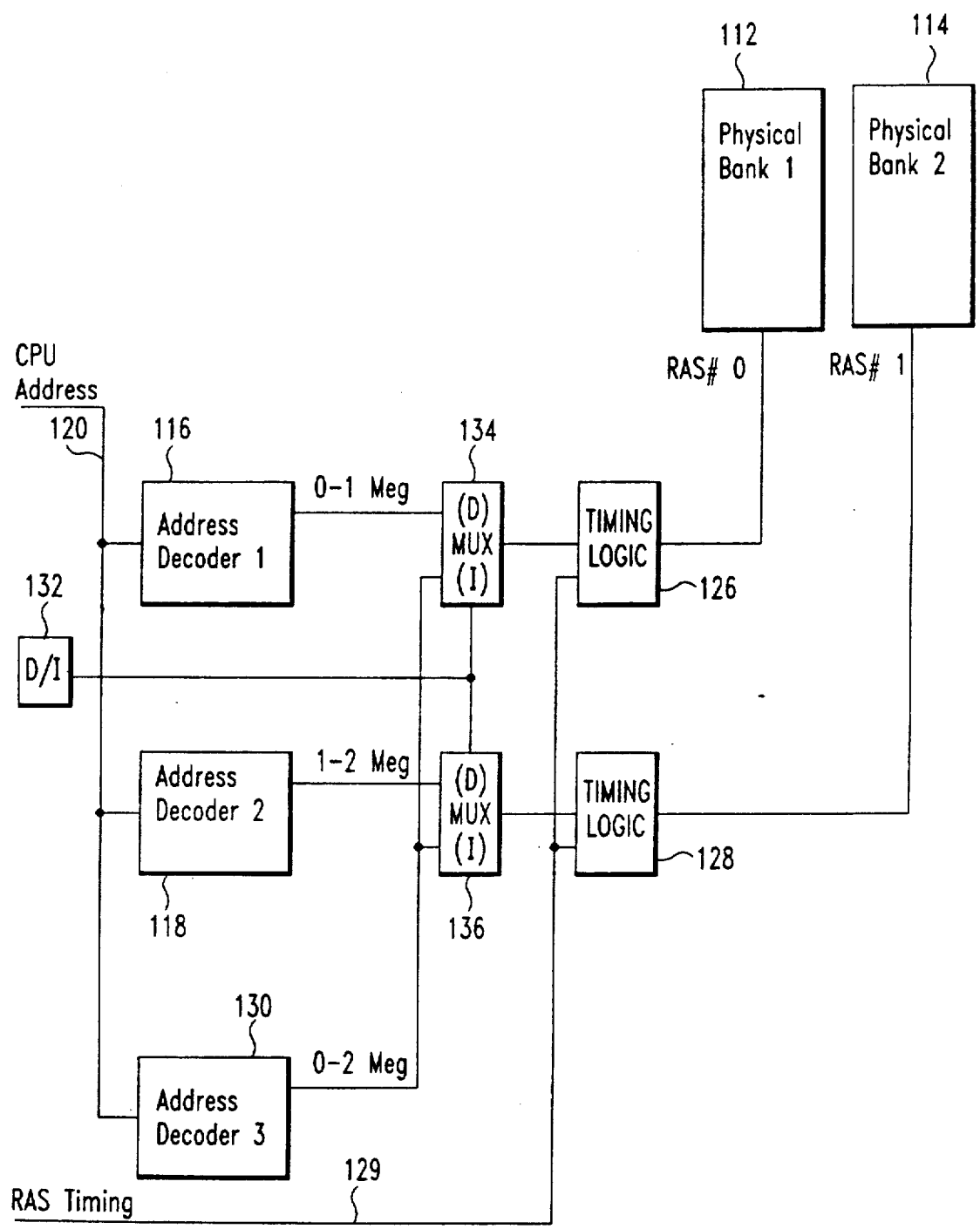
FIG. 3 is a view similar to FIGS. 1 and 2 showing a prior art system operable in either a direct mode or an interleaved mode.
Figure 4:
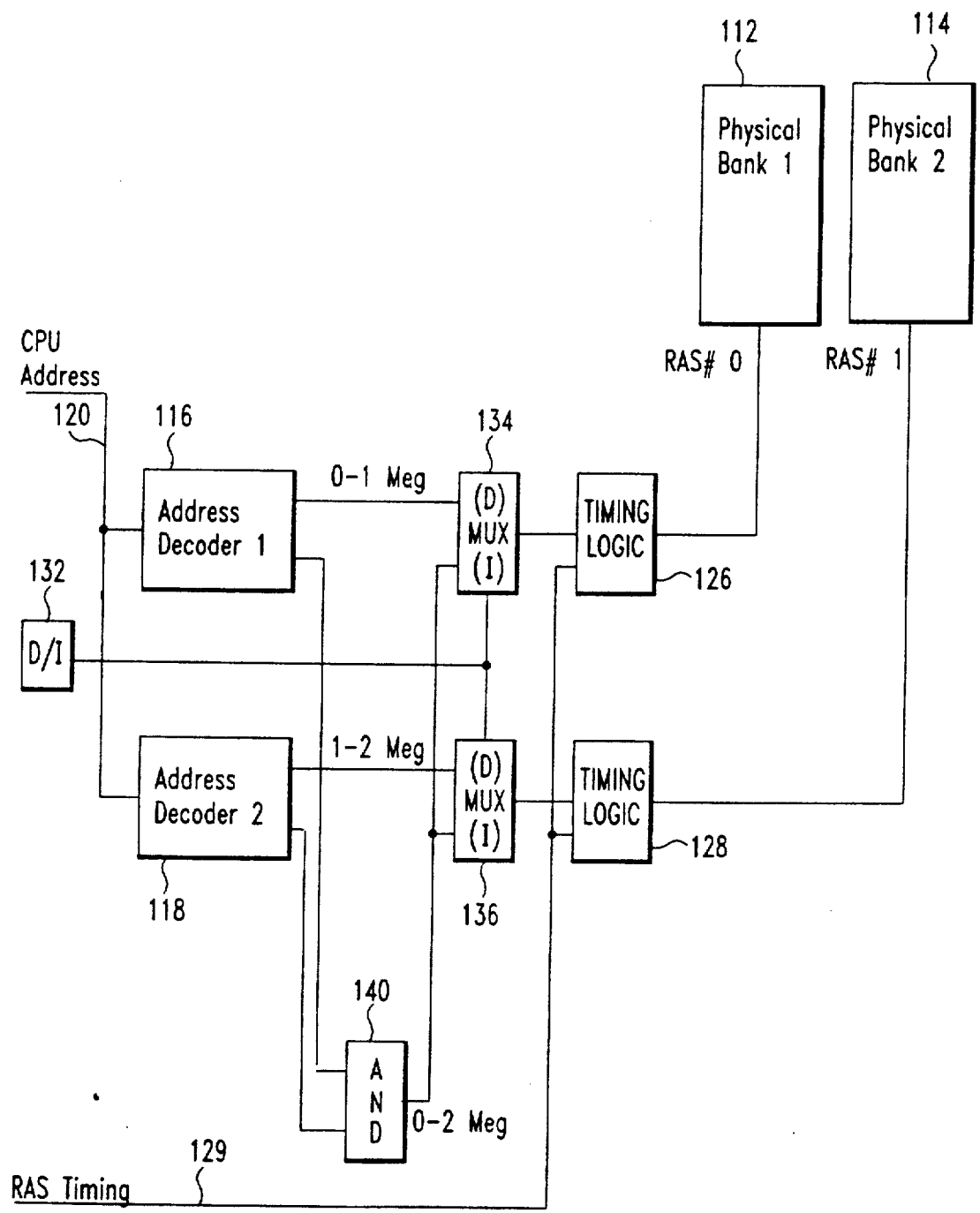
FIG. 4 is a view similar to FIG. 3 illustrating the improvement of the invention.

Prior art memory systems of the type improved upon by the invention are shown in FIGS. 1-3, while a comparable diagram illustrating the invention is shown in FIG. 4. Referring to FIG. 1, the invention is described hereinafter relative to a dynamic memory system 110 having two banks of single in-line memory modules (SIMM) 112 and 114. Each SIMM has one meg of addressable locations, and is 32 bits wide. That is, on each access, 32 bits or one doubleword may be transferred. Two active low, address decoders 116 and 118 are connected to an address bus 120. Decoder 116 produces an active Bank Select output signal when the addressed location is within the first one meg of memory locations and decoder 118 will produce an active output Bank Select signal when the addressed location is within the range from one to two megs. Decoders 116 and 118 have output lines respectively connected to timing circuits 126 and 128. In response to an address appearing on bus 120, the one of decoders 116 and 118 corresponding to the bank being accessed will produce an active Bank Select signal that is transmitted to the timing circuit which then produces the appropriate operating signals, including a RAS signal, to access the desired location in the selected bank. Such mode of operation is known as the direct mode.

FIG. 2 shows the same memory banks arranged for interleave operation wherein the banks are combined to provide a 64 bit wide memory data path. In this case, a decoder 130 is connected to bus 120 and in response thereto will produce an active Bank Select signal when the accessed address is in the range 0-2 megs. Decoder 130 is connected to timing logic circuit and 128 which in response to receiving an active Bank Select signal and a RAS timing signal on line 129 transmits RAS0 and RAS1 signals to banks 112 and 114 respectively. The RAS timing signal controls the high/low timing of the individual RAS0 and RAS1 pulses.

FIG. 3 illustrates a system for supporting both direct and interleave modes. A register 132 stores a control signal (D/I) defining the mode of operation and the memory is accessed in either a direct mode or an interleave mode dependent upon the control signal. To accomplish this, the system further includes two multiplexers or MUXes 134 and 136 which are connected to register 132 and are operable in accordance with the control signal D/I to transmit a Bank Select signal to each bank from decoder 130 when in the interleaved mode, or a Bank Select signal to each bank from decoders 116 and 118 when in the direct mode.

During the course of designing a memory controller for use in a high performance personal computer, in which an objective of such design was to provide a memory controller that supports both interleave and direct modes of operation, we analyzed the above prior art designs and noted a relationship that allows the two decoders designed for the direct mode to be additionally used for the interleave mode by replacing decoder 130 with a simple AND circuit to thereby achieve the same results while reducing the number of circuits. Referring to FIG. 4, an AND circuit 140 has two inputs connected to the outputs of decoders 116 and 118 and an output connected to inputs of MUXes 134 and 136. When operating in the direct mode, MUXes 134 and 136 will transmit only the active output signal from decoders 116 or 118 dependent on which Bank Select signal is active. When operating in the interleave mode, the MUXes 134 and 136 will both transmit an active signal from AND circuit 140 to simultaneously access both banks 12 and 14. Circuit 140 effectively creates a single logical memory bank from two physical banks, in which the logical bank has an address range 0-2 megs.

The simplicity of the invention and why an AND circuit can be used should be understandable from the following logical reasoning. The output of decoder 116 is active or low only when the addressed location is in the range 0-1 meg. The output of decoder 118 is active or low only when the addressed location is in the range 1-2 megs. If the addressed location is above such range, the outputs of both decoders will be inactive or high. The logic of AND circuit 140 is such that when either or both inputs are active, its output will be active. If both are high or inactive, the output will likewise be high or inactive.

Figure 5:
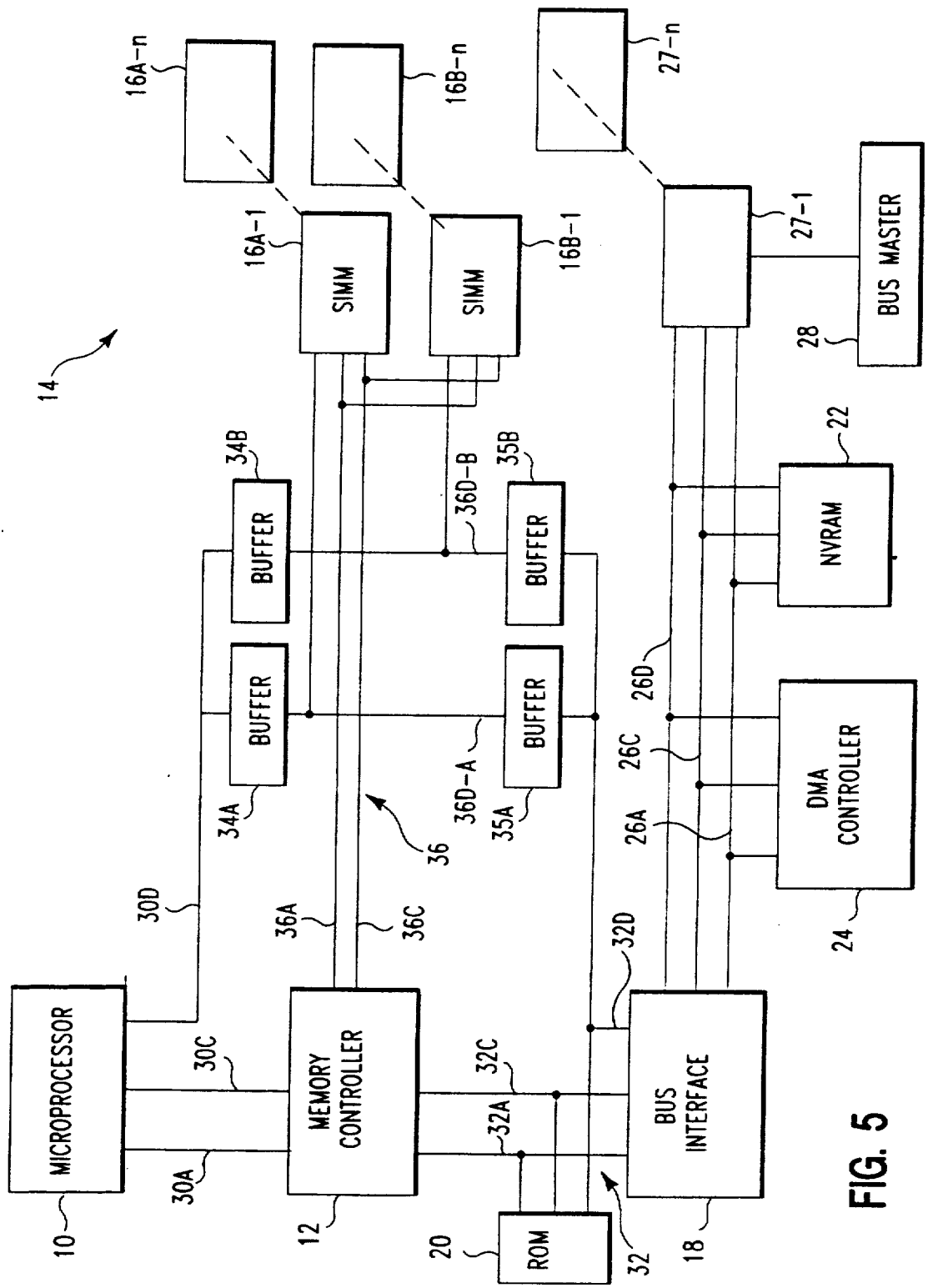
FIG. 5 is a more detailed block diagram of a data processing system embodying the invention.

Referring now to FIG. 5, the data processing system there shown includes a microprocessor 10, a memory controller 12, a memory 14 having a plurality of SIMMs 16-1 through 16-n, a bus interface 18, a read only memory (ROM) 20 for storing a basic input/output operating system (BIOS), a non-volatile RAM (NVRAM) 22 for storing setup and configuration information, a direct memory access (DMA) controller 24, an expansion bus 26 connected to a plurality of expansion sockets 27-1 through 27-n, and a busmaster 28 connected to expansion socket 27-1. Controller 12 is a dual port controller connected to a CPU bus 30 and a system bus 32. A data bus 30D is connected between microprocessor 10 and a buffer 34, and a data bus 32D is connected between bus interface 18 and a buffer 35. Buffers 34 and 35 are connected to memory 14 by the data bus 36D of a memory bus 36. It should be noted that the address, control, and data busses of busses 26, 30, 32 and 36 are referenced using the respective suffixes A, C, and D.

Except for certain details of controller 12 and operation as described below, the system is constructed in accordance with known principles and uses well documented, commercially available devices so that further details thereof not necessary to an understanding of the invention are omitted herefrom. It is to be understood that the many support and other devices commonly included in a data processing system have been omitted for simplicity of illustration.

Within the system as described thus far, memory 14 can be accessed by microprocessor 10, DMA controller 24, or bus master 28. Since such memory accessing is similar for each such device, the following description will be limited to illustrating how microprocessor 10 accesses memory 14. It is apparent to those skilled in the art how other devices can similarly access the memory. Furthermore, it is recognized there are many different memory configurations but for the purpose of illustrating the invention, memory 14 is assumed to have a maximum capacity of eight, 32-bit wide SIMMs, each SIMM having one or two banks, each bank having a capacity of 1 or 4 Mbytes, and operable at RAS speeds of 30-100 ns. Additional memory can be added through use of the expansion bus.

Figure 6:
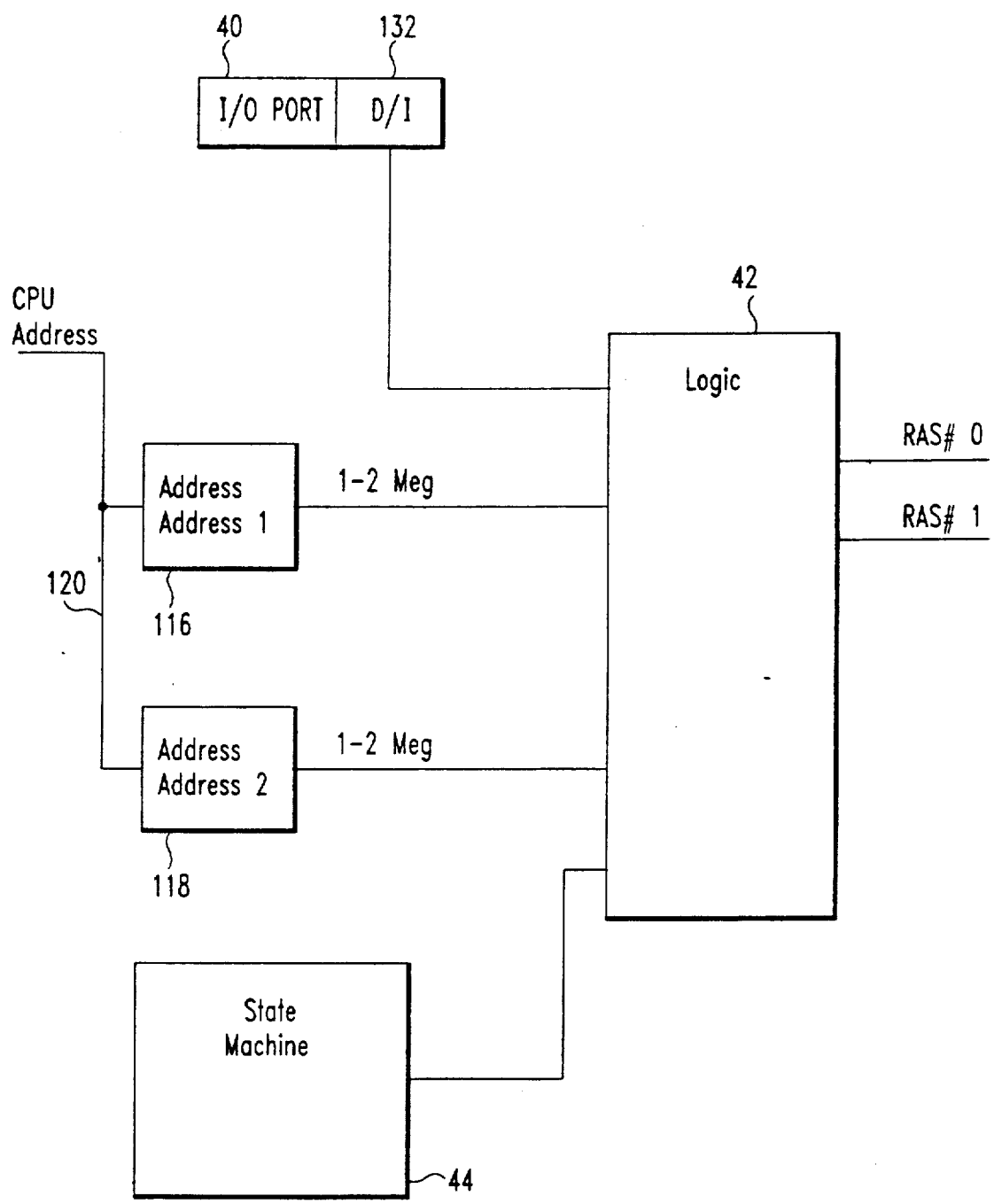
FIG. 6 is a block diagram of a portion of the memory controller shown in FIG. 5.

FIG. 6 shows generally how the invention is incorporated into memory controller 12. Address bus 120 receives a bank address from bus 30 (FIG. 5) and inputs such address into decoders 116 and 118. The outputs of the decoders are connected to inputs of a logic circuit 42 which includes MUXes 134 and 136, and AND circuit 140. An I/0 port 40 contains register 132. When the system is initially configured, and the user decides whether to have the system operate in a direct mode or an interleaved mode, the control signal in register 132 is then set by addressing such port and writing the appropriate D/I signal in the register. Normally, once a system as thus set to operate in a given mode, it remains that way. Register 132 is connected to transmit the mode control signal D/L to logic 42. Controller 12 also includes a state machine 44 that in response to address and control signals from the microprocessor on bus 30, provides timing signals to logic 42 causing appropriate memory operating signals, including the RAS signals, to be transmitted to memory 14 to access the bank containing the addressed memory location.

While the invention is described above relative to a one Meg SIMM, for which there is an advantage of replacing one eight-to-one decoder by a single AND circuit, the advantage becomes even greater when the complexity of a decoder is increased to handle various size SIMMs and various starting addresses.

It should be apparent to those skilled in the art that many changes can be made in the details and arrangements of steps and parts without departing from the scope of the invention as defined in the appended claims.

What is claimed is:

1. A data processing system comprising:
   a microprocessor;
   a memory including a first memory bank and a second memory bank, said first memory bank having a plurality of addressable memory location located within a first range of addresses, said second memory bank having a plurality of addressable memory locations located with a second range of addresses contiguous to said first range, said first memory bank being accessible by a plurality of signals including a first row address strobe (RAS) signal, said second memory bank being accessible by a plurality of signals including a second RAS signal;
   a memory controller for controlling access to said memory;
   and a bus connected between said microprocessor and said memory controller, said bus comprising address, data and control lines;
   said microprocessor being operable to initiate a memory access by placing address signals on said address lines and control signals defining read/write operations on said control lines;

said memory controller having an interleaved mode of operation and a direct mode of operation, said memory controller comprising
- a first bank address decoder having an input connected to said address lines, said first bank decoder being operative in response to decoding an address on said address lines as being in said first range of addresses to generate a first Bank Select signal,
- a second bank address decoder having an input connected to said address lines, said second bank decoder being operative in response to decoding an address on said address lines as being in said second range of addresses to generate a second Bank Select signal,
- a single logical circuit having a first input and a second input respectively connected to said first decoder and to said second decoder to respectively receive said first Bank Select signal and said second Bank Select signal, said logical circuit being operable to produce an active output signal in response to receiving one of said first and second Bank Select signals from one of said first and second decoders;
- mode control means having first and second inputs and first and second outputs, said first and second inputs respectively connected to said first decoder and to said second decoder to respectively receive said first bank select signal and said second bank select signal, said first and second inputs being further connected to said logical circuit to receive said active output signal therefrom, said mode control means being selectively set to operate in either one of a direct mode and an interleave mode, said mode control means being operable when set to operate in direct mode to pass said first bank select signal to said first output and pass said second bank select signal to said second output, said mode control means being operable when set to operate in said interleave mode to pass said active output signal from said logical circuit to both said first output and said second output;
- and timing means connected to said first and second outputs of said mode control means for receiving signals passed by said mode control means, said timing means being further connected to said memory banks for selectively accessing said banks in response to said signals passed by said mode control means, whereby in response to said decoders receiving a single address a single one of said memory banks is accessed when said mode control means operates in said direct mode and both of said memory banks are accessed when said mode control means operates in said interleave mode.

2. A data processing system in accordance with claim 1 wherein said mode control means comprises:
- a register for storing a mode control signal defining the mode of operation of said memory controller;
- and multiplexer means including said first and second inputs and said first and second outputs of said mode control means, said multiplexer further having a control input connected to said register to receive said mode control signal and operate in accordance with said control signal.

3. A data processing system in accordance with claim 2 comprising:
- an I/O port, said register being part of said I/O port and being settable upon writing said mode control signal to said I/O port.

* * * * *